United States Patent
Hu et al.

(10) Patent No.: US 10,068,853 B2
(45) Date of Patent: Sep. 4, 2018

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Yu-Hsiang Hu, Hsinchu (TW); Hung-Jui Kuo, Hsinchu (TW); Yi-Wen Wu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/147,909

(22) Filed: May 5, 2016

(65) Prior Publication Data

US 2017/0323853 A1 Nov. 9, 2017

(51) Int. Cl.
*H01L 23/538* (2006.01)
*H01L 21/56* (2006.01)
*H01L 21/48* (2006.01)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/565* (2013.01); *H01L 23/5383* (2013.01); *H01L 23/5384* (2013.01); *H01L 23/5386* (2013.01)

(58) Field of Classification Search
CPC ............. H01L 21/4853; H01L 21/4857; H01L 21/486; H01L 21/565
See application file for complete search history.

(56) References Cited

U.S. PATENT DOCUMENTS

| | | | | | |
|---|---|---|---|---|---|
| 7,442,581 | B2* | 10/2008 | Lytle | .................... | B29C 33/301 438/118 |
| 8,327,532 | B2* | 12/2012 | Xu | ........................ | H01L 21/568 257/686 |
| 8,519,544 | B2* | 8/2013 | Kim | ........................ | H01L 24/97 257/774 |
| 8,544,167 | B2* | 10/2013 | Morita | ................ | H01L 21/6835 29/831 |
| 2005/0098891 | A1* | 5/2005 | Wakabayashi | ........ | H01L 21/568 257/758 |

(Continued)

*Primary Examiner* — Peniel M Gumedzoe
(74) *Attorney, Agent, or Firm* — JCIPRNET

(57) ABSTRACT

An integrated fan-out package including an integrated circuit, an insulating encapsulation, and a redistribution circuit structure is provided. The integrated circuit includes an active surface, a plurality of sidewalls connected to the active surface, and a plurality of pads distributed on the active surface. The insulating encapsulation encapsulates the active surface and the sidewalls of the integrated circuit. The insulating encapsulation includes a plurality of first contact openings and a plurality of through holes, and the pads are exposed by the first contact openings. The redistribution circuit structure includes a redistribution conductive layer, wherein the redistribution conductive layer is disposed on the insulating encapsulation and is distributed in the first contact openings and the through holes. The redistribution conductive layer is electrically connected to the pads through the first contact openings. A method of fabricating the integrated fan-out package is also provided.

12 Claims, 12 Drawing Sheets

(56) References Cited

U.S. PATENT DOCUMENTS

| | | | | |
|---|---|---|---|---|
| 2005/0205978 A1* | 9/2005 | Pu | ............... | H01L 23/3128 |
| | | | | 257/678 |
| 2006/0006534 A1* | 1/2006 | Yean | ............... | H01L 23/5389 |
| | | | | 257/737 |
| 2006/0087045 A1* | 4/2006 | Yamano | ............... | H01L 21/568 |
| | | | | 257/787 |
| 2006/0163740 A1* | 7/2006 | Ohno | ............... | H01L 23/49816 |
| | | | | 257/762 |
| 2009/0008762 A1* | 1/2009 | Jung | ............... | H01L 23/5389 |
| | | | | 257/686 |
| 2010/0140788 A1* | 6/2010 | Jin | ............... | H01L 23/49811 |
| | | | | 257/695 |
| 2011/0241218 A1* | 10/2011 | Meyer | ............... | H01L 25/16 |
| | | | | 257/774 |
| 2012/0119379 A1* | 5/2012 | Koizumi | ............... | H01L 23/5389 |
| | | | | 257/774 |

* cited by examiner

INTEGRATED FAN-OUT PACKAGE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the formation of the redistribution circuit structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
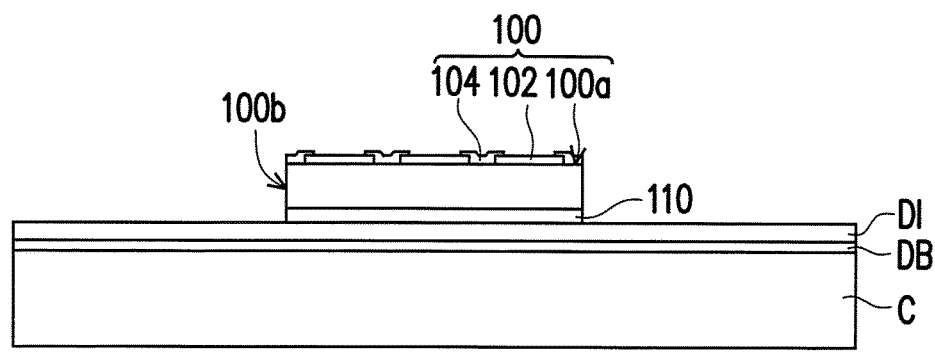
FIGS. 1 through 11 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 11 illustrate a process flow for fabricating an integrated fan-out package in accordance with some embodiments.

Referring to FIG. 1, a carrier C having a de-bonding layer DB and a dielectric layer DI formed thereon is provided, wherein the de-bonding layer DB is formed between the carrier C and the dielectric layer DI. In some embodiments, the carrier C is a glass substrate, the de-bonding layer DB is a light-to-heat conversion (LTHC) release layer formed on the glass substrate, and the dielectric layer DI is a photosensitive polybenzoxazole (PBO) layer formed on the de-bonding layer DB, for example. In alternative embodiments, the de-bonding layer DB may be a photo-curable release film whose viscosity is decreased by photo-curing process or a thermal curable release film whose viscosity is decreased by thermal-curing process, and the dielectric layer DI may be made from other photosensitive or non-photosensitive dielectric materials.

After the carrier C having the de-bonding layer DB and the dielectric layer DI formed thereon is provided, an integrated circuit 100 including an active surface 100a, a plurality of sidewalls 100b, a plurality of pads 102 distributed on the active surface 100a, and a passivation layer 104 is then mounted on the carrier C having the dielectric layer DI formed thereon. Specifically, the integrated circuit 100 is mounted on the dielectric layer DI. As shown in FIG. 1, the passivation layer 104 covers the active surface 100a of the integrated circuit 100, and the pads 102 are partially exposed by the passivation layer 104. In some embodiments, the pads 102 are aluminum pads or other metal pads, and the passivation layer 104 is a photosensitive polybenzoxazole (PBO) layer, for example.

In some embodiments, the integrated circuit 100 is adhered with the dielectric layer DI through a die-attach film (DAF) 110 or the like. For example, the material of the die-attach film 110 includes phenolic base materials or epoxy base materials.

Figure 2:
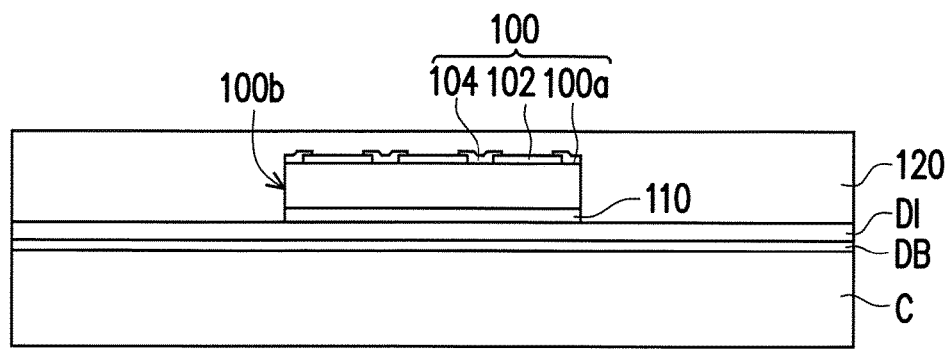

Referring to FIG. 2, an insulating material 120 is formed on the dielectric layer DI so as to cover the integrated circuit 100 and the die-attach film 110. In some embodiments, the insulating material 120 is a molding compound formed by molding process. The pads 102 and the passivation layer 104 of the integrated circuit 100 are entirely covered by the insulating material 120. Furthermore, the sidewalls 100b of the integrated circuit 100 are encapsulated by the insulating material 120. The maximum thickness of the insulating material 120 is greater than the thickness of the integrated circuit 100 such that the sidewalls 100b, the pads 102 and the passivation layer 104 of the integrated circuit 100 are not revealed by the insulating material 120. In other words, the top surface of the insulating material 120 is higher than the active surface 100a of the integrated circuit 100. The insulating material 120 includes epoxy or other suitable resins, for example. In some alternative embodiments, the insulating material 120 may be formed by photo pattern-able molding compounds, such as phenolic resin, epoxy resin, or combinations thereof. In some embodiments, the insulating material 120 may further include inorganic filler or inorganic compound (e.g. silica, clay, and so on) can be added therein so as to optimize coefficient of thermal expansion (CTE) of the insulating material 120.

As shown in FIG. 2, the dimension (e.g., thickness and width) of the insulating material 120 is greater than the dimension (e.g., thickness and width) of the integrated circuit 100. The insulating material 120 not only covers the dielectric layer DI, but also encapsulates the active surface 100a and the sidewalls 100b of the integrated circuit 100. In some embodiments, the insulating material 120 may have a planar top surface.

Figure 3:
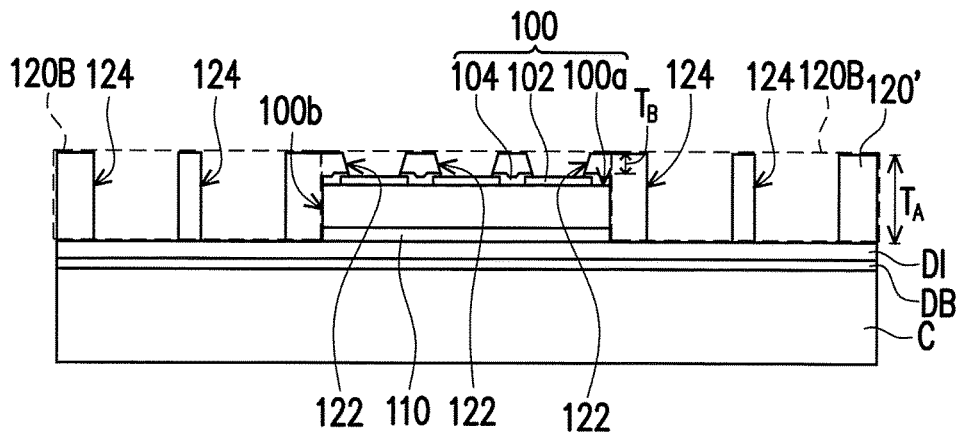

Referring to FIG. 3, after the insulating material 120 is formed, the insulating material 120 is patterned to form an insulating encapsulation 120'. The insulating encapsulation 120' partially encapsulates the active surface 100a of the integrated circuit 100 and entirely encapsulates the sidewalls 100b of the integrated circuit 100. The insulating encapsulation 120' includes a plurality of first contact openings 122 for exposing the pads 102 and a plurality of through holes 124 for exposing the dielectric layer DI. In some embodiments, the insulating encapsulation 120' may include a first encapsulation portion 120A and a second encapsulation portion 120B connected to the first encapsulation portion 120A, wherein the first encapsulation portion 120A covers the active surface 100a of the integrated circuit 100, and the second encapsulation portion 120B covers the sidewalls 100b of the integrated circuit 100 and extends outward from the first encapsulation portion 120A and the sidewalls 100b of the integrated circuit 100.

As shown in FIG. 3, the thickness $T_A$ of the first encapsulation portion 120A is smaller than the thickness $T_B$ of the second encapsulation portion 120B. The first contact openings 122 are formed and distributed in the first encapsulation portion 120A of the insulating encapsulation 120' while the through holes 124 are formed and distributed in the second encapsulation portion 120B of insulating encapsulation 120'.

As shown in FIG. 2 and FIG. 3, the first contact openings 122 and the through holes 124 distributed in the insulating encapsulation 120' may be simultaneously formed by photolithography when the insulating material 120 is formed by photo pattern-able molding compounds. However, the patterning of the insulating material 120 is not limited thereto. In some alternative embodiments, since the first contact openings 122 and the through holes 124 are different in dimension and require different process requirements, the first contact openings 122 and the through holes 124 may be formed by different processes respectively. For example, during the formation (e.g. molding process) of the insulating material 120, the through holes 124 are formed simultaneously, and the first contact openings 122 are then formed in the insulating material 120 having the through holes 124. The insulating material 120 having the through holes 124 distributed therein are formed by molding process, and the first contact openings 122 are formed by photolithography, for instance.

The dimension (e.g., depth and width) of the first contact openings 122 formed in the first encapsulation portion 120A is smaller than the dimension (e.g., depth and width) of through holes 124 formed in the second encapsulation portion 120A. In some embodiments, the arranging pitch of the first contact openings 122 is smaller than that of the through holes 124.

Referring to FIG. 4 through FIG. 8, after the insulating encapsulation 120' is formed, a redistribution circuit structure RDL (shown in FIG. 8) electrically connected to the pads 102 of the integrated circuit 100 is formed on the insulating encapsulation 120' and on portions of the dielectric layer DI exposed by the through holes 124. The redistribution circuit structure RDL (shown in FIG. 8) is fabricated to electrically connect to the pads 102 of the integrated circuit 100. The fabrication process flow of the redistribution circuit structure RDL (shown in FIG. 8) is described in accompany with FIG. 4 through FIG. 8 in detail.

Figure 4:
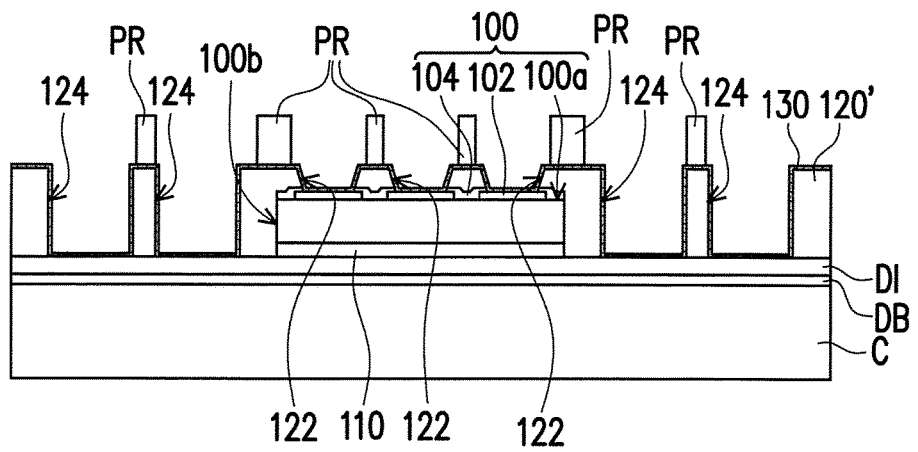

Referring to FIG. 4, a seed layer 130 is conformally sputtered, for example, on the insulating material 120, the pads 102 exposed by the first contact openings 122, and the portions of the dielectric layer 140 exposed by the through holes 124. For example, the seed layer 130 is a titanium/copper composited layer, wherein the sputtered titanium thin film is in contact with the insulating material 120, the pads 102 exposed by the first contact openings 122, and the portions of the dielectric layer 140 exposed by the through holes 124. In addition, the sputtered copper thin film is formed on the sputtered titanium thin film. After the seed layer 130 is deposited, a patterned photoresist layer PR is formed on the seed layer 130. The patterned photoresist layer PR includes openings corresponding to the first contact openings 122 and the through holes 124, and portions of the seed layer 130 are exposed by the openings of the photoresist layer PR.

It is noted that, before the seed layer 130 is formed, no additional dielectric material is required to be formed over the insulating encapsulation 120'. The insulating encapsulation 120' provides a planar surface for fabrication of the sequentially formed redistribution circuit structure RDL (shown in FIG. 8).

Figure 5:
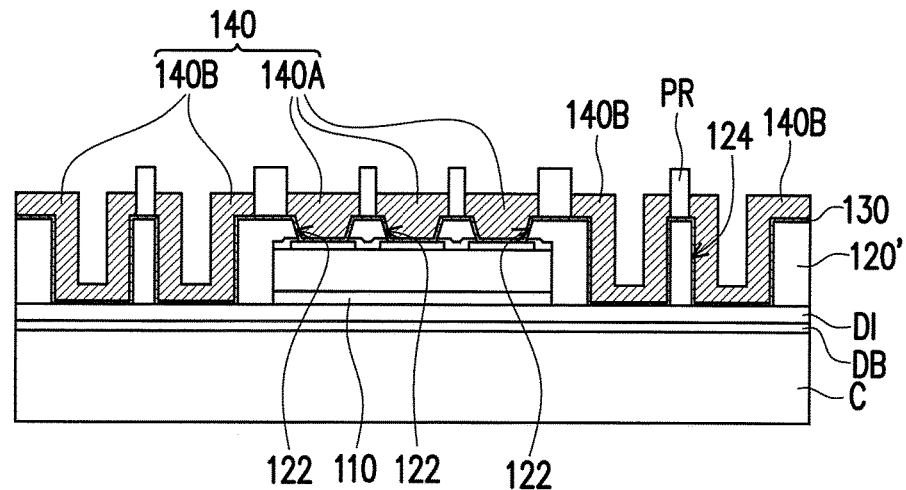

Referring to FIG. 5, a plating process is performed to form a redistribution conductive layer 140 on portions of the seed layer 130. The redistribution conductive layer 140 is plated on the portions of the seed layer 130 exposed by the openings of the patterned photoresist layer PR. In some embodiments, the redistribution conductive layer 140 includes a plurality of first conductive patterns 140A corresponding to the first contact openings 122 and a plurality of second conductive patterns 140B corresponding to the through holes 124. Since the dimension (e.g., depth and width) of the first contact openings 122 is smaller than the dimension (e.g., depth and width) of through holes 124, the gap filling capacity of the first conductive patterns 140A is more obvious than that of the second conductive patterns 140B. Accordingly, the first contact openings 122 may be filled by the first conductive patterns 140A, and the through holes 124 may not be filled by the second conductive patterns 140B. As shown in FIG. 5, the second conductive patterns 140B conformally cover the surface of the insulating encapsulation 120' in the proximity of the through holes 124 such that the through holes 124 are partially occupied by the second conductive patterns 140B. In other words, the through holes 124 are not fully occupied by the second conductive patterns 140B. In some alternative embodiments, the profile and the gap filling capacity of the second conductive patterns 140B may be modified through proper adjustment of thin-film deposition recipe.

Figure 6:
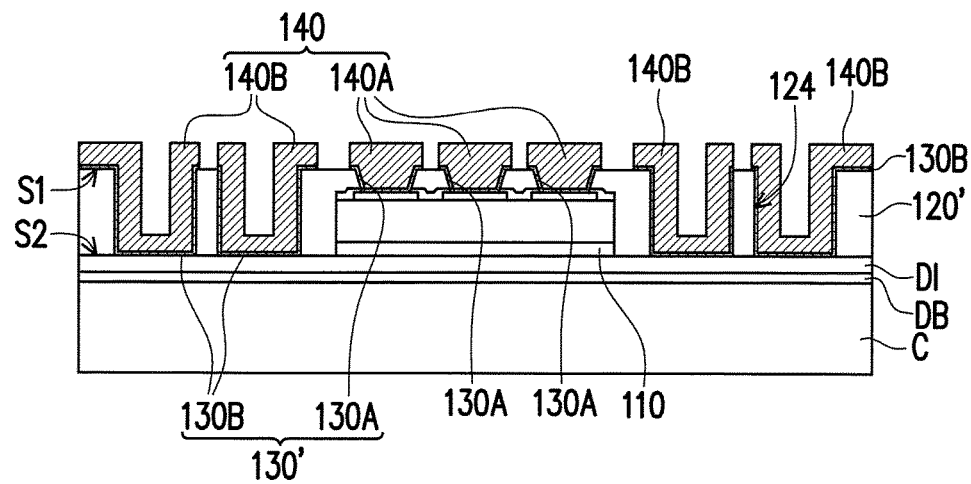

Referring to FIG. 6, after the redistribution conductive layer 140 is formed, the patterned photoresist layer PR is stripped such that the portions of the seed layer 130 that are not covered by the redistribution conductive layer 140 are exposed.

As shown in FIG. 6, by using the redistribution conductive layer 140 as a hard mask, the portions of the seed layer 130 uncovered by the redistribution conductive layer 140 are removed so as to form a patterned seed layer 130' under the redistribution conductive layer 140. The patterned seed layer 130' includes a plurality of first seed patterns 130A and a plurality of second seed patterns 130B. The first seed patterns 130A are between the pads 102 and the first conductive patterns 140A, and the second seed patterns 130B are between the insulating encapsulation 120' and the second conductive patterns 140B. In some embodiments, the seed layer 130 is patterned by etching until the insulating encapsulation 120' is exposed. After the patterned seed layer 130' is formed under the redistribution conductive layer 140, the first conductive patterns 140A of the redistribution conductive layer 140 are electrically connected to the pads 102 of the integrated circuit 100 through the first seed patterns 130A in the first contact openings 122.

As shown in FIG. 6, the first conductive patterns 140A and the second conductive patterns 140B are not merely distributed within the first contact openings 122 and the through holes 124. The first conductive patterns 140A further extend from the first contact openings 122 of the insulating encapsulation 120' so as to partially cover the first surface S1 of the insulating encapsulation 120', and the second conductive patterns 140B further extend from the through holes 124 of the insulating encapsulation 120' so as to partially cover the first surface S1 of the insulating encapsulation. The second conductive patterns 140B of the redistribution conductive layer 140 penetrate the insulating encapsulation 120'. In other words, the second conductive patterns 140B are simultaneously exposed at the first surface S1 and the second surface S2 of the insulating encapsulation 120'.

It is noted that, for some signal transmission purpose, parts of the first conductive patterns 140A may be electrically connected to the second conductive patterns 140B (not shown in the cross-sectional view illustrated in FIG. 6).

As shown in FIG. 6, the redistribution conductive layer 140 not only re-layouts the pads 102 of the integrated circuit 100, but also serves as conductive through vias in the insulating encapsulation 120'. In some embodiments, the first conductive patterns 140A of the redistribution conductive layer 140 re-layout the pads 102 of the integrated circuit 100, and the second conductive patterns 140B of the redistribution conductive layer 140 serve as conductive through vias. In other words, the fabrication process of the conductive through vias distributed in the insulating encapsulation 120' is integrated into the fabrication process of the bottommost redistribution conductive layer 140 of the redistribution circuit structure.

Figure 7:
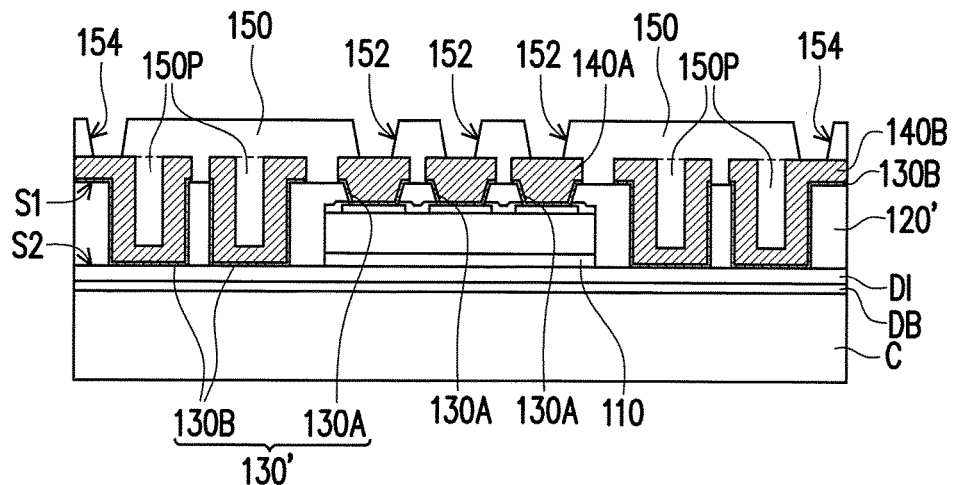

Referring to FIG. 7, after the redistribution conductive layer 140 is formed on the insulating encapsulation 120', an inter-dielectric layer 150 is formed to cover the redistribution conductive layer 140 and the insulating encapsulation 120'. The inter-dielectric layer 150 includes a plurality of protrusions 150P protruding into the through holes 124. The protrusions 150P of the inter-dielectric layer 150 are in contact with the second conductive patterns 140B of the redistribution conductive layer 140, as shown in FIG. 7. Furthermore, the inter-dielectric layer 150 may include a plurality of contact openings 152 for exposing the first conductive patterns 140A and the second conductive patterns 140B.

Figure 8:
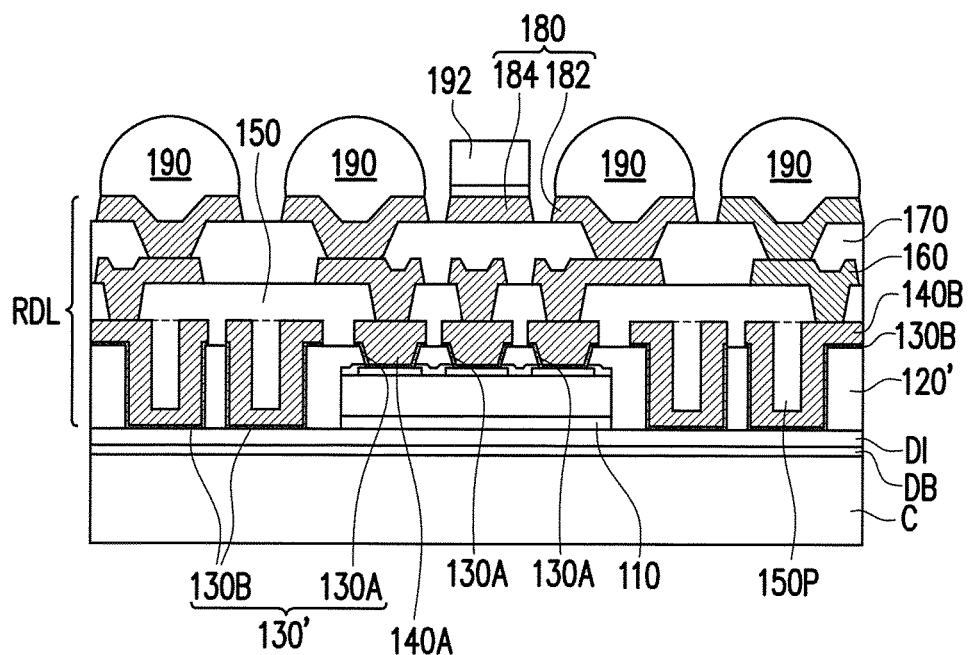

Referring to FIG. 8, in some embodiments, after the redistribution conductive layer 140 and the inter-dielectric layer 150 are formed, steps illustrated in FIG. 4 through 7 may be repeated at least one time so as to fabricate the redistribution circuit structure RDL over the integrated circuit 100 and the insulating encapsulation 120'. The redistribution circuit structure RDL includes a plurality of inter-dielectric layers (150 and 170) and a plurality of redistribution conductive layers (140, 160 and 180) stacked alternately. In some embodiment, the topmost redistribution conductive layer 180 of the redistribution circuit structure RDL may include a plurality of under-ball metallurgy (UBM) patterns 182 for electrically connecting with conductive balls and/or at least one connection pad 184 for electrically connecting with at least one passive component.

After the redistribution circuit structure RDL is formed, a plurality of conductive balls 190 are placed on the under-ball metallurgy patterns 182, and a plurality of passive components 192 are mounted on the connection pads 184. In some embodiments, the conductive balls 190 may be placed on the under-ball metallurgy patterns 182 by ball placement process, and the passive components 192 may be mounted on the connection pads 184 through reflow process. It is noted that passive components 192 and the connection pad 184 for electrically connecting with at least one passive component 192 are not necessary in some embodiments.

Figure 9:
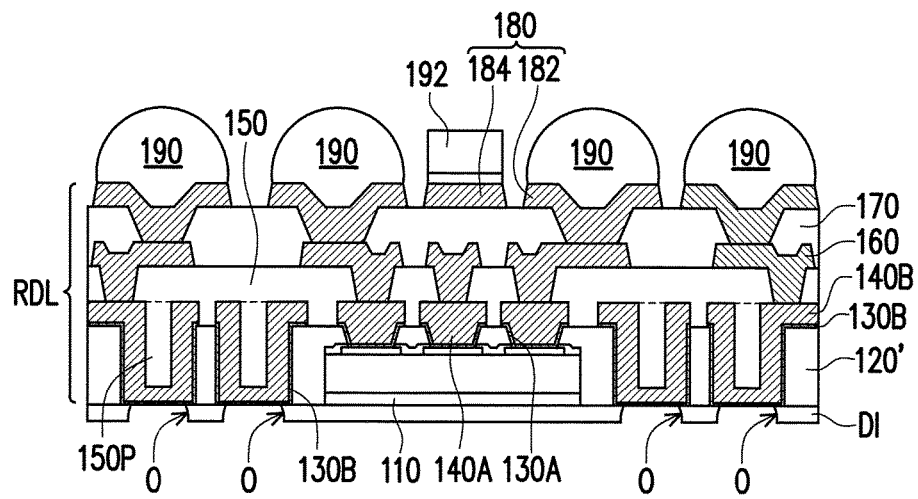

Referring to FIG. 8 and FIG. 9, after the conductive balls 190 and/or the passive components 192 are formed, the dielectric layer DI is de-bonded from the de-bonding layer DB such the dielectric layer DI is separated or delaminated from the de-bonding layer DB and the carrier C. In some embodiments, the de-bonding layer DB (e.g., the LTHC release layer) may be irradiated by an UV laser such that the dielectric layer DI is peeled from the carrier C.

As shown in FIG. 9, the dielectric layer DI is then patterned such that a plurality of second contact openings O are formed to expose the bottom surfaces of the second conductive patterns 140B. The number of the contact openings O formed in the dielectric layer DI is corresponding to the number of the second conductive patterns 140B.

Figure 10:
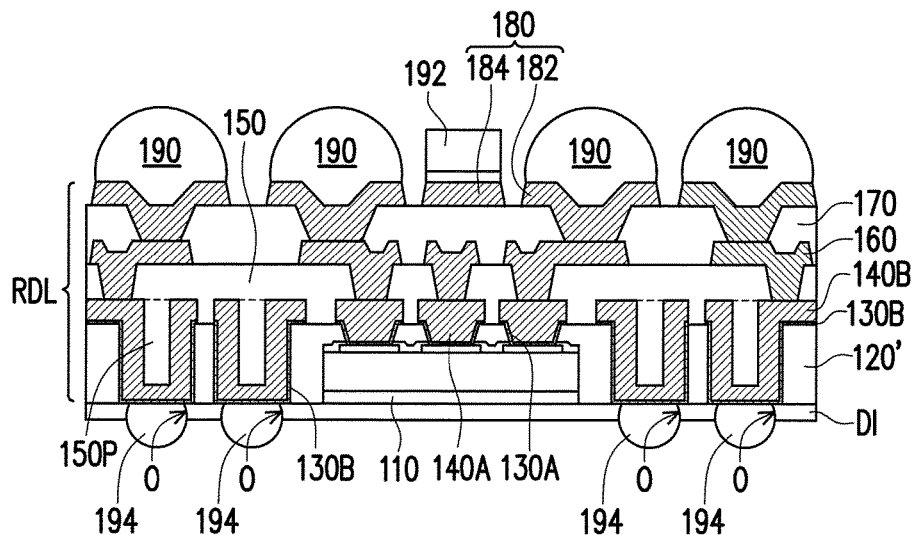

Referring to FIG. 10, after the contact openings O is formed in the dielectric layer DI, a plurality of terminals 194 (e.g., conductive balls) are placed on the bottom surfaces of the second conductive patterns 140B that are exposed by the contact openings O. And, the terminals 194 (e.g., conductive balls) are, for example, reflowed to bond with the exposed surfaces of the second conductive patterns 140B. In other words, the terminals 194 are electrically connected to the second conductive patterns 140B. As shown in FIG. 10, after the conductive balls 190 and the terminals 194 are formed, an integrated fan-out package of the integrated circuit 100 having dual-side terminals is accomplished.

Figure 11:
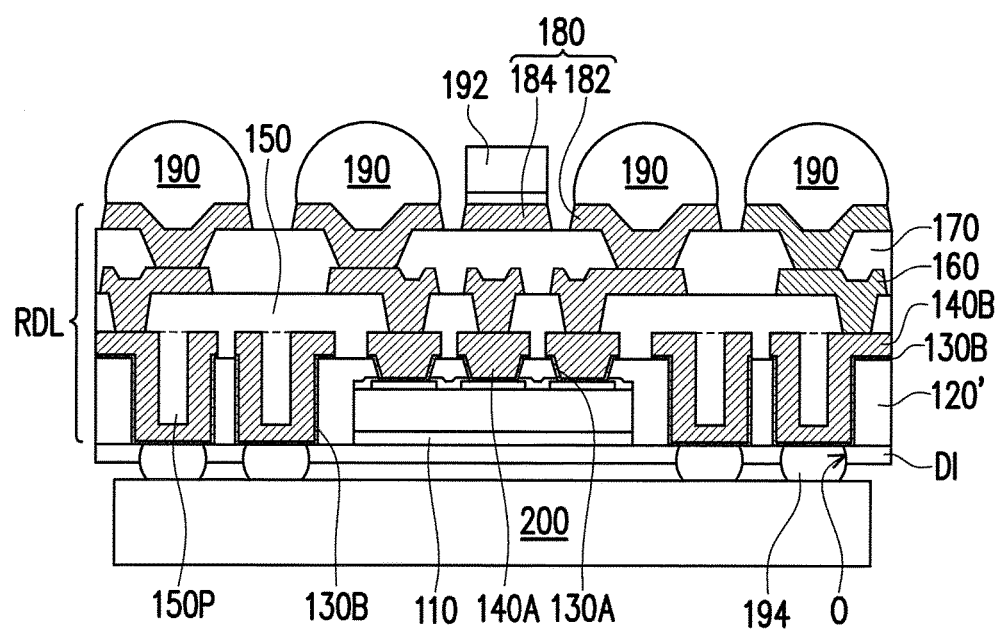

Referring to FIG. 11, another package 200 is then provided. In some embodiments, the package 200 is, for example, a memory device. The package 200 is stacked over and is electrically connected to the integrated fan-out package illustrated in FIG. 10 through the conductive balls 194 such that a package-on-package (POP) structure is fabricated.

FIGS. 12 through 22 illustrate another process flow for fabricating an integrated fan-out package in accordance with some alternative embodiments.

Figure 12:
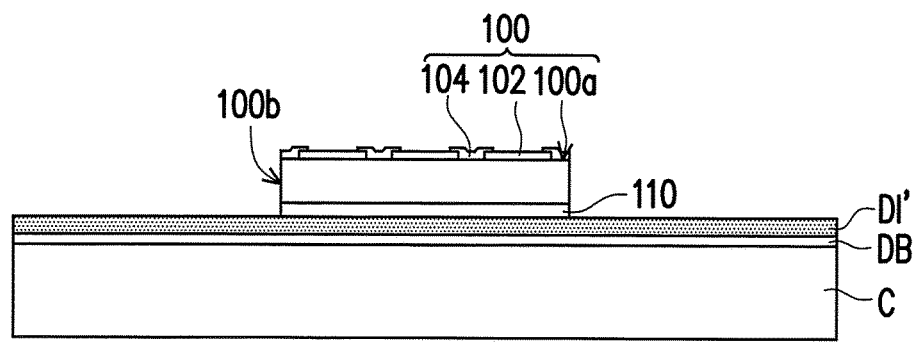
FIGS. 12 through 22 illustrate another process flow for fabricating an integrated fan-out package in accordance with some alternative embodiments.
Figure 13:
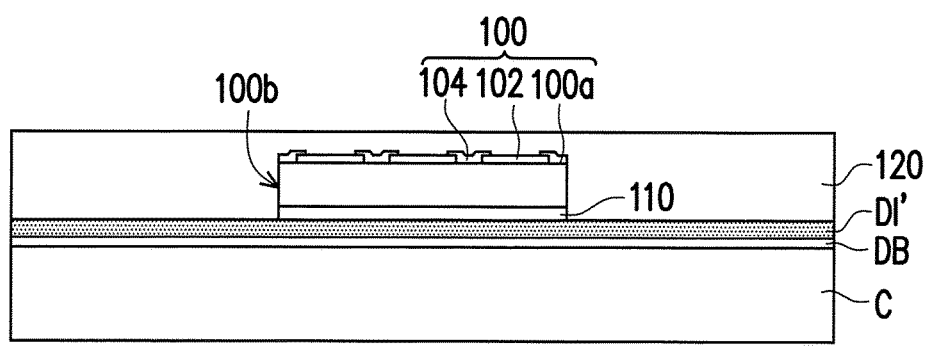
Figure 14:
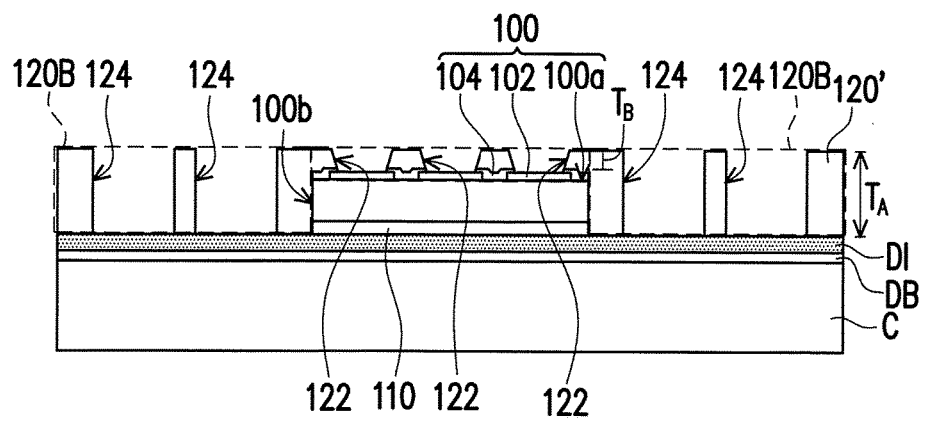
Figure 15:
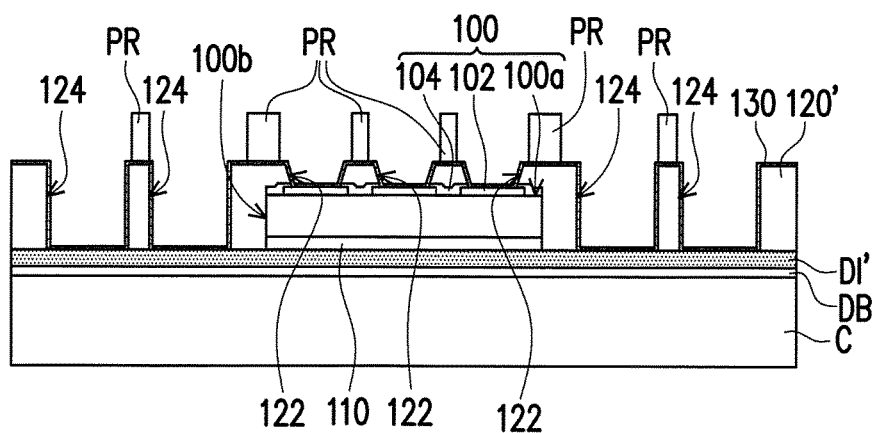
Figure 16:
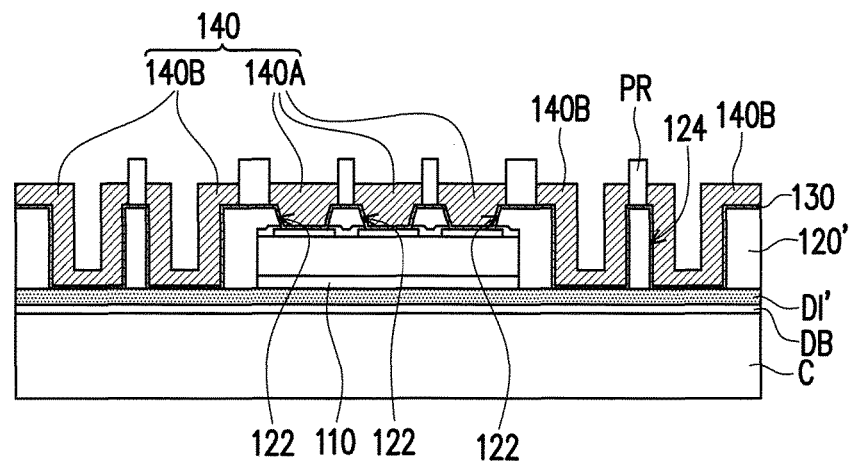
Figure 17:
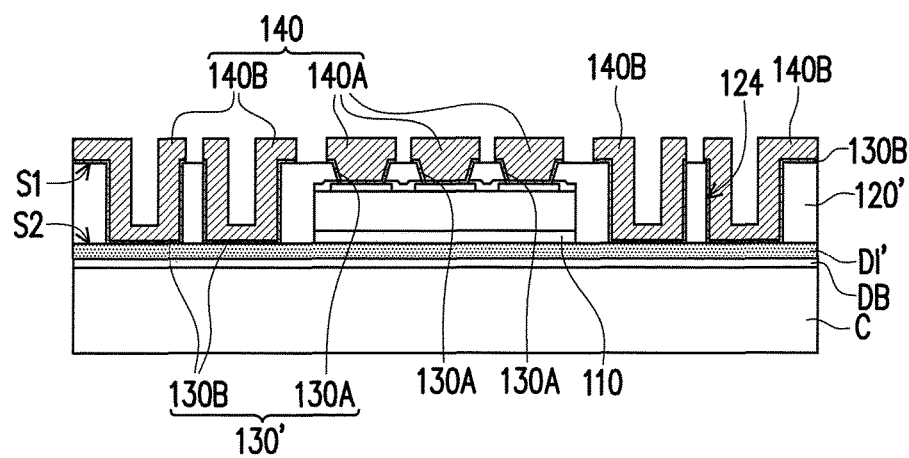
Figure 18:
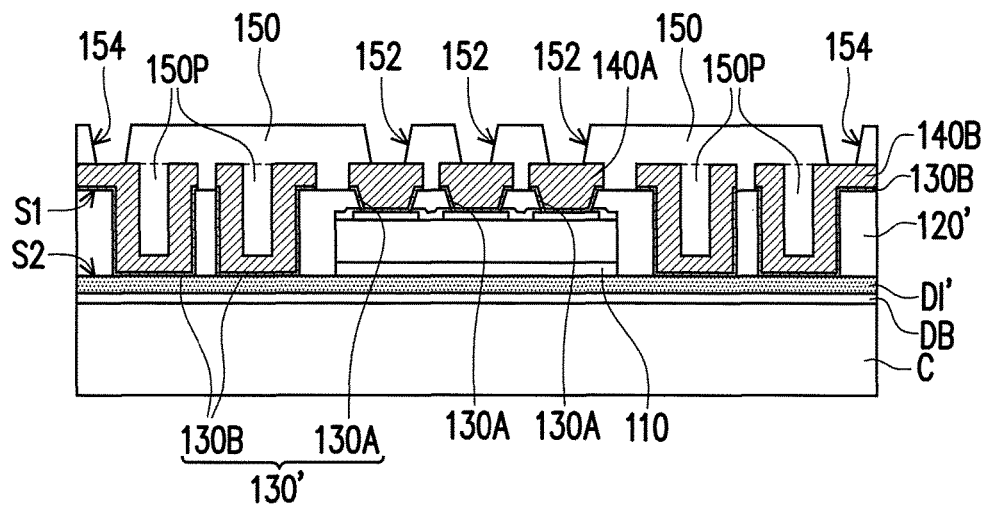
Figure 19:
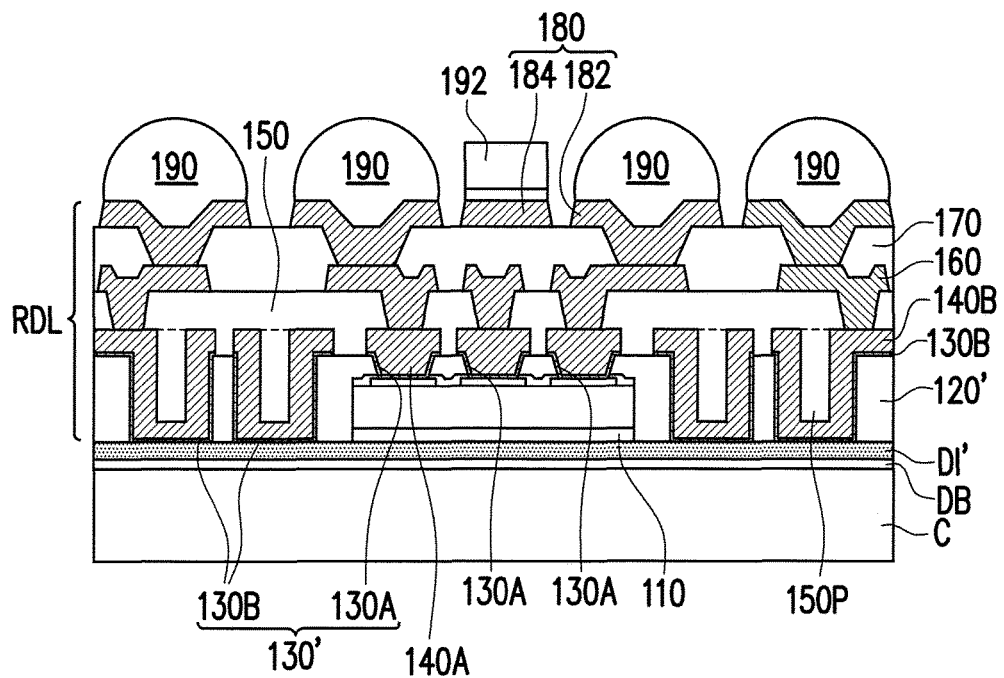
Figure 21:
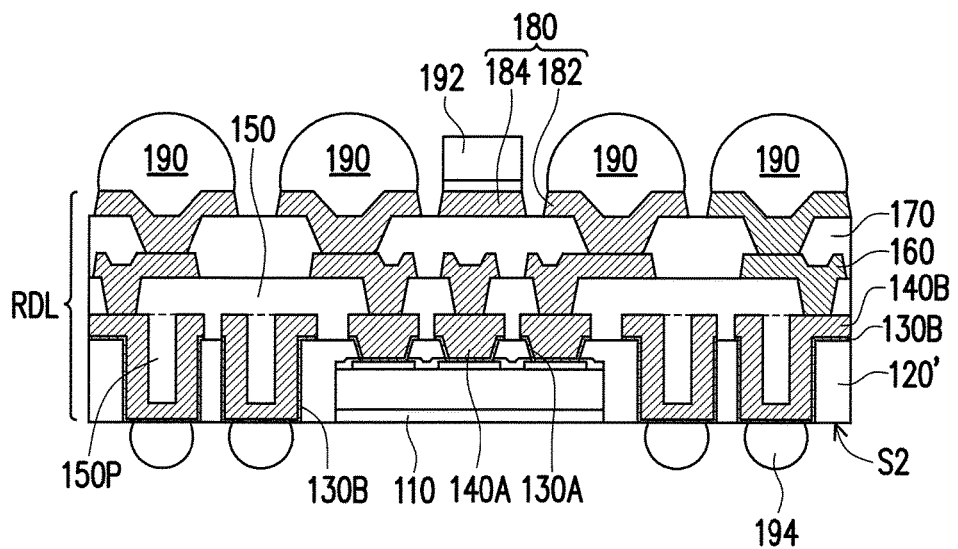

Referring to FIG. 12, a carrier C having a de-bonding layer DB and a sacrificial dielectric layer DI' formed thereon is provided, wherein the de-bonding layer DB is formed between the carrier C and the sacrificial dielectric layer DI'. In some embodiments, the carrier C is a glass substrate, the de-bonding layer DB is a light-to-heat conversion (LTHC) release layer formed on the glass substrate, and the sacrificial dielectric layer DI' is a silicon nitride layer, a silicon oxide layer, or the like formed on the de-bonding layer DB, for example. In alternative embodiments, the de-bonding layer DB may be a photo-curable release film whose viscosity may be decreased by photo-curing process or a thermal curable release film whose viscosity may be decreased by thermal-curing process, and the dielectric layer DI may be made from other photosensitive or non-photosensitive dielectric materials. In the present embodiment, the sacrificial dielectric layer DI' is formed and designed to be removed sequentially (as shown in FIG. 21).

After the carrier C having the de-bonding layer DB and the sacrificial dielectric layer DI' formed thereon is provided, an integrated circuit 100 including an active surface 100a, a plurality of sidewalls 100b, a plurality of pads 102 distributed on the active surface 100a, and a passivation layer 104 is mounted on the carrier C having the dielectric layer DI formed thereon. Specifically, the integrated circuit 100 is mounted on the surface of the sacrificial dielectric layer DI'.

Referring to FIG. 13 through FIG. 19, the process flow illustrated in FIG. 13 through FIG. 19 is similar with the process flow illustrated in FIG. 2 through FIG. 8. The detailed descriptions regarding to FIG. 13 through FIG. 19 are thus omitted.

Figure 20:
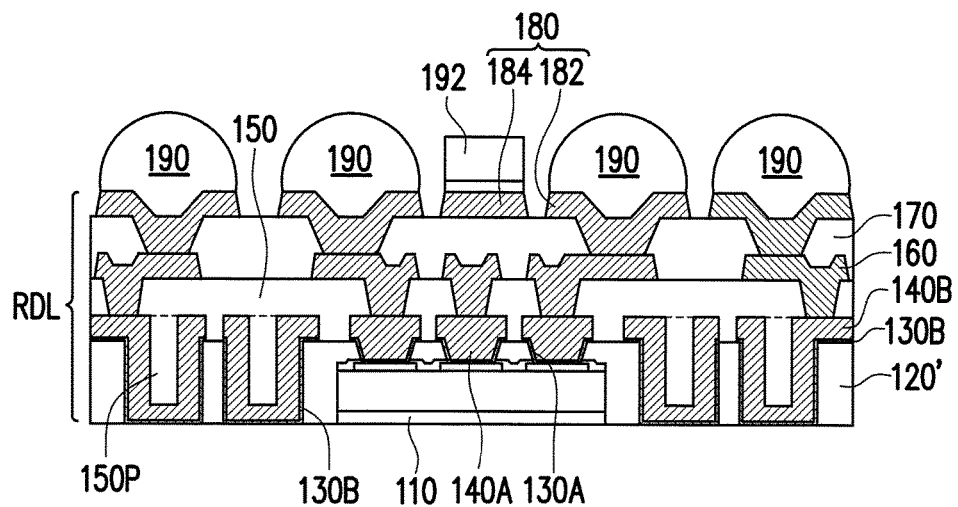

Referring to FIG. 20, after the redistribution circuit structure RDL, the conductive balls 190 and the passive components 192 are formed, the sacrificial dielectric layer DI' is de-bonded from the de-bonding layer DB such the sacrificial dielectric layer DI' is separated or delaminated from the carrier C. In some embodiments, the de-bonding layer DB (e.g., the LTHC release layer) may be irradiated by an UV laser such that the sacrificial dielectric layer DI' is peeled from the carrier C. As shown in FIG. 20, the sacrificial dielectric layer DI' is then removed such that the second surface S2 of the insulating encapsulation 120' and the bottom surfaces of the second conductive patterns 140B are exposed.

Referring to FIG. 21, after the sacrificial dielectric layer DI' is removed, a plurality of terminals 194 (e.g., conductive balls) are placed on the bottom surfaces of the second conductive patterns 140B. And, the terminals 194 (e.g., conductive balls) are, for example, reflowed to bond with the bottom surfaces of the second conductive patterns 140B. In other words, the terminals 194 are electrically connected to the second conductive patterns 140B. As shown in FIG. 21, after the conductive balls 190 and the terminals 194 are formed, another integrated fan-out package of the integrated circuit 100 having dual-side terminal is accomplished.

Figure 22:
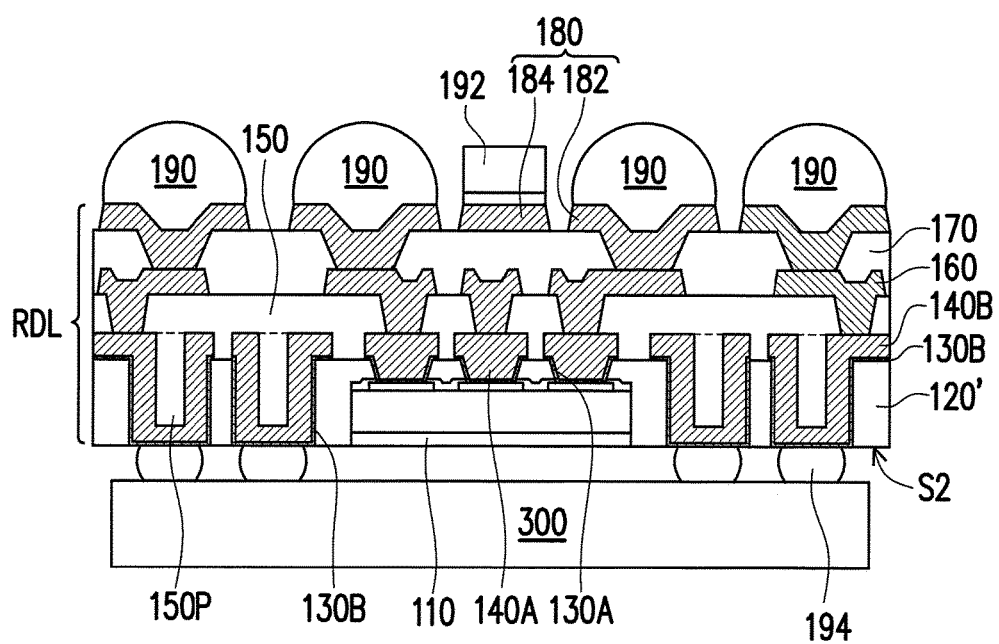

Referring to FIG. 22, another package 300 is then provided. In some embodiments, the package 300 is, for example, a memory device. The package 300 is stacked over and is electrically connected to the integrated fan-out package illustrated in FIG. 21 through the conductive balls 194 such that a package-on-package (POP) structure is fabricated.

In the above-mentioned embodiments, since the fabrication process of the conductive through vias in the insulating encapsulation is integrated into the fabrication process of the bottommost redistribution conductive layer of the redistribution circuit structure, the fabrication costs of the integrated fan-out packages may be reduced and the fabrication process of the integrated fan-out packages is simple.

In accordance with some embodiments of the present disclosure, an integrated fan-out package including an integrated circuit, an insulating encapsulation, and a redistribution circuit structure is provided. The integrated circuit includes an active surface, a plurality of sidewalls connected to the active surface, and a plurality of pads distributed on the active surface. The insulating encapsulation encapsulates the active surface and the sidewalls of the integrated circuit. The insulating encapsulation includes a plurality of first contact openings and a plurality of through holes, and the pads are exposed by the first contact openings. The redistribution circuit structure includes a redistribution conductive layer, wherein the redistribution conductive layer is disposed on the insulating encapsulation and is distributed in the first contact openings and the through holes. The redistribution conductive layer is electrically connected to the pads through the first contact openings.

In accordance with alternative embodiments of the present disclosure, a method of fabricating an integrated fan-out package is provided. The method includes the following steps. An integrated circuit is mounted on a carrier, wherein the integrated circuit includes an active surface, a plurality of sidewalls connected to the active surface, and a plurality of pads distributed on the active surface. An insulating encapsulation is formed on the carrier, wherein the insulating encapsulation covers the carrier and encapsulates the active surface and the sidewalls of the integrated circuit. The insulating encapsulation includes a plurality of first contact openings and a plurality of through holes, and the pads are exposed by the first contact openings. A redistribution circuit structure is formed on the insulating encapsulation. The redistribution circuit structure includes a redistribution conductive layer, wherein the redistribution conductive layer is disposed on the insulating encapsulation and is distributed in the first contact openings and the through holes. The redistribution conductive layer is electrically connected to the pads through the first contact openings. The carrier is removed to expose portions of the redistribution conductive layer distributed in the through holes.

In accordance with yet alternative embodiments of the present disclosure, another method of fabricating an integrated fan-out package is provided. The method includes the following steps. A carrier having a de-bonding layer and a dielectric layer disposed thereon is provided, wherein the de-bonding layer being between the carrier and the dielectric layer. An integrated circuit is mounted on the dielectric layer, wherein the integrated circuit includes an active surface, a plurality of sidewalls connected to the active surface, and a plurality of pads distributed on the active surface. An insulating encapsulation is formed on the dielectric layer, wherein the insulating encapsulation covers the dielectric layer and encapsulates the active surface and the sidewalls of the integrated circuit. The insulating encapsulation includes a plurality of first contact openings for exposing the pads and a plurality of through holes for exposing the dielectric layer. A redistribution circuit structure is formed on the insulating encapsulation, wherein the redistribution circuit structure includes a redistribution conductive layer. The redistribution conductive layer is disposed on the insulating encapsulation and is distributed in the first contact openings and the through holes. The redistribution conductive layer is electrically connected to the pads through the first contact openings. The carrier is de-bonded from the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated fan-out package, the method comprising:
   mounting an integrated circuit die on a carrier, the integrated circuit die comprising an active surface, a plurality of sidewalls connected to the active surface, and a plurality of pads distributed on the active surface;

forming an insulating encapsulation on the carrier, the insulating encapsulation covering the carrier and encapsulating the active surface and the sidewalls of the integrated circuit die, the insulating encapsulation comprising a plurality of first contact openings for exposing the pads and a plurality of through holes;

forming a redistribution circuit structure comprising a first redistribution conductive layer on the insulating encapsulation, a first inter-dielectric layer covering the first redistribution conductive layer, a second redistribution conductive layer on the first inter-dielectric layer, and a second inter-dielectric layer covering the second redistribution conductive layer, wherein the first inter-dielectric layer comprises a plurality of contact openings that are offset from the through holes, and the second redistribution conductive layer is electrically connected to the first redistribution conductive layer through the contact openings, wherein the first redistribution conductive layer comprises a plurality of first conductive patterns electrically connected to the pads through the first contact openings and a plurality of second conductive patterns located in the through holes; and removing the carrier to expose portions of the first redistribution conductive layer distributed in the through holes.

2. The method of claim 1, wherein the insulating encapsulation comprises a photo patternable molding compound formed by molding.

3. The method of claim 1, wherein the second conductive patterns conformally cover and partially occupy the through holes of the insulating encapsulation.

4. The method of claim 1, wherein at least one of the first conductive pattern is electrically connected to one of the second conductive patterns.

5. A method of fabricating an integrated fan-out package, the method comprising:

providing a carrier having a de-bonding layer and a dielectric layer disposed thereon, the de-bonding layer being between the carrier and the dielectric layer;

mounting an integrated circuit die on the dielectric layer, the integrated circuit die comprising an active surface, a plurality of sidewalls connected to the active surface, and a plurality of pads distributed on the active surface;

forming an insulating encapsulation on the dielectric layer, the insulating encapsulation covering the dielectric layer and encapsulating the active surface and the sidewalls of the integrated circuit die;

forming a plurality of first contact openings for exposing at least one of the pads and a plurality of through holes for exposing the dielectric layer in the insulating encapsulation;

forming a redistribution circuit structure, comprising:

forming a first redistribution conductive layer on the insulating encapsulation, the first redistribution conductive layer comprising a plurality of first conductive patterns electrically connected to the pads through the first contact openings and a plurality of second conductive patterns located in the through holes, the second conductive patterns conformally covering the through holes of the insulating encapsulation, and the through holes being partially occupied by the second conductive patterns;

forming a first inter-dielectric layer covering the first redistribution conductive layer, the first inter-dielectric layer comprising a plurality of protrusions extending into the through holes, wherein the first inter-dielectric layer comprises a plurality of contact openings that are misaligned with the protrusions;

forming at least one second redistribution conductive layer on the first inter-dielectric layer, wherein the second redistribution conductive layer is electrically connected to the first redistribution conductive layer through the contact openings;

forming a second inter-dielectric layer covering the second redistribution conductive layer; and de-bonding the carrier from the dielectric layer.

6. The method of claim 5 further comprising:
patterning the dielectric layer to form a plurality of second contact openings after de-bonding the carrier from the dielectric layer, wherein portions of the first redistribution conductive layer distributed in the through holes are exposed by the second contact openings.

7. The method of claim 5 further comprising:
after de-bonding the carrier from the dielectric layer, removing the dielectric layer to expose portions of the first redistribution conductive layer distributed in the through holes.

8. The method of claim 5, wherein the first contact openings are filled by the first conductive patterns.

9. The method of claim 8, wherein the insulating encapsulation comprises a photo patternable molding compound formed by molding.

10. A method of fabricating an integrated fan-out package, the method comprising:

mounting an integrated circuit die on a de-bonding layer carried by a carrier, the integrated circuit die comprising an active surface, a plurality of sidewalls connected to the active surface, and a plurality of pads distributed on the active surface;

forming an insulating encapsulation on the de-bonding layer carried by the carrier to cover the de-bonding layer and encapsulate the active surface and the sidewalls of the integrated circuit die, the insulating encapsulation comprising a plurality of first contact openings for exposing the pads and a plurality of through holes;

forming a first redistribution conductive layer on the insulating encapsulation, wherein the first redistribution conductive layer comprises a plurality of first conductive patterns and a plurality of second conductive patterns, the first conductive patterns are electrically connected to the pads through the first contact openings, and the second conductive patterns conformally cover and partially occupy the through holes of the insulating encapsulation;

forming a first inter-dielectric layer covering the first redistribution conductive layer, wherein the first inter-dielectric layer comprises a plurality of protrusions extending into the through holes, and the first inter-dielectric layer comprises a plurality of contact openings that are offset from the protrusions;

forming at least one second redistribution conductive layer on the first inter-dielectric layer, the second redistribution conductive layer being electrically connected to the first redistribution conductive layer through the contact openings;

forming at least one second inter-dielectric layer covering the at least one second redistribution conductive layer; and removing the carrier and the de-bonding layer to expose portions of the first redistribution conductive layer distributed in the through holes.

11. The method of claim 10, wherein the insulating encapsulation comprises a photo patternable molding compound formed by molding.

12. The method of claim 10, wherein at least one of the first conductive patterns is electrically connected to one of the second conductive patterns.

* * * * *